United States Patent [19]

Ferretti et al.

[11] Patent Number: 5,066,356

[45] Date of Patent: Nov. 19, 1991

[54] HYDROTHERMAL PROCESS FOR GROWING OPTICAL-QUALITY SINGLE CRYSTALS

[75] Inventors: August Ferretti, Wilmington, Del.; Thurman E. Gier, Chadds Ford, Pa.

[73] Assignee: E. I. du Pont de Nemours and Company, Wilmington, Del.

[21] Appl. No.: 461,562

[22] Filed: Jan. 5, 1990

[51] Int. Cl.$^5$ ............................................. C30B 7/10
[52] U.S. Cl. ............................ 156/623 R; 156/621; 156/624; 156/DIG. 71; 156/DIG. 75; 156/DIG. 81
[58] Field of Search ............... 156/621, 623 R, 623 Q, 156/624, DIG. 71, DIG. 75, DIG. 81

[56] References Cited

U.S. PATENT DOCUMENTS

| | | | |
|---|---|---|---|
| 3,949,323 | 4/1976 | Bierlein et al. | 332/7.51 |
| 4,305,778 | 12/1981 | Gier | 156/623 R |
| 4,654,111 | 3/1987 | Laudise | 156/623 R |
| 4,740,265 | 4/1988 | Bierlein et al. | 156/DIG. 71 |
| 4,746,396 | 5/1988 | Marnier | 156/623 R |
| 4,761,202 | 8/1988 | Bordui et al. | 156/DIG. 71 |
| 4,766,954 | 8/1988 | Bierlein et al. | 156/DIG. 71 |
| 4,961,819 | 10/1990 | Marnier | 156/623 R |

OTHER PUBLICATIONS

Jacco et al., "Flux Growth and Properties of KTiOPO$_4$", Journal of Crystal Growth, vol. 70 (1984), pp. 484–488.

Laudise et al., "Phase Relations, Solubility and Growth of Potassium Titanyl Phosphate KTP", Journal of Crystal Growth, vol. 74 (1986), pp. 275–280.

Belt et al., "Low Temperature Hydrothermal Growth of KTiOPO$_4$ (KTP)", SPIE Proc. 968, 100 (1988).

Jia et al., "The Solubility of KTiOPO$_4$ (KTP) in KF Aqueous Solution Under High Temperature and High Pressure".

Belt et al., "Nonlinear Optical Materials for Second Harmonic Generative (KTP)".

*Primary Examiner*—Robert Kunemund

[57] ABSTRACT

A hydrothermal process for growing a crystal of MTiOXO$_4$ at an elevated temperature is disclosed which employs a growth medium comprising a mineralizer solution, and is characterized as employing aqeuous mineralizer solution in which the concentration of M is at least about 8 molar, and as employing a growth region temperature of less than about 500° C. and/or a pressure of less than 14,000 psi during crystallization. M is selected from the group consisting of K, Rb, Tl and NH$_4$ and mixtures thereof, and X is selected from the group consisting of P and As and mixtures thereof.

20 Claims, No Drawings

HYDROTHERMAL PROCESS FOR GROWING OPTICAL-QUALITY SINGLE CRYSTALS

FIELD OF THE INVENTION

This invention relates to producing optically useful crystals of $KTiOPO_4$ and certain of its analogs and more particularly to a hydrothermal process for producing such crystals at reduced temperature and pressure conditions.

BACKGROUND OF THE INVENTION

The need for optical-quality single crystals of materials exhibiting nonlinear optical properties is well established in the art. Potassium titanyl phosphate (i.e. KTP) is particularly useful in nonlinear optical devices, as described, for example, in U.S. Pat. No. 3,949,323. For many optical applications utilizing crystals optical-quality crystals having dimensions on the order of one millimeter or more are generally desired.

U.S. Pat. No. 3,949,323 discloses the preparation of crystals of compounds such as potassium titanyl phosphate by hydrothermal methods. Hydrothermal crystal growth processes have typically been high pressure processes involving crystal formation from a growth medium comprising mineralizer solution. A nutrient source such as a polycrystalline composition of the same material be provided, and seed crystals are often used to provide nucleation sites. Hydrothermal methods of crystal growth are considered particularly advantageous relative to flux methods of crystal growth for certain applications since they often produce crystals of relatively lower ionic conductivity. However, hydrothermal methods also typically require expensive reaction vessels to withstand the temperatures and/or pressures associated with crystal growth conditions and can involve crystal growth periods on the order of four to eight weeks to achieve crystals of the desired size and optical quality.

U.S. Pat. No 4,305,778 discloses a hydrothermal process for crystal growth of a group of materials including potassium titanyl phosphate which utilizes a mineralizer solution comprising at least in part a stable glass composition that minimizes the tendency of the seed crystals to dissolve in the aqueous mineralizer solution before nutrient can migrate to the seed crystals. Jia et al., "The Solubility of $KTiOPO_4$ (KTP) in KF Aqueous Solution Under High Temperature and High Pressure", Journal of Crystal Growth, 79 (1986), pp. 970–973, discloses that by utilizing KF as a mineralizer relatively lower temperature and pressure can be employed for a hydrothermal KTP crystal growth process, and use of a pressure as low as 1000 $Kg/cm^2$ (i.e. 14223 psi) is exemplified. Laudise et al., "Phase Relations, Solubility and Growth of Potassium Titanyl Phosphate, KTP", Journal of Crystal Growth 74,275 (1986) discusses various reactions relating to KTP as a function of temperature and KTP crystal growth at 10 Kpsi.

R. F. Belt et al. "Low Temperature Hydrothermal Growth of $KTiOPO_4$ (KTP)" SPIG Proceedings 968 100 (1988) and U.S. Pat. No. 4,654,111 disclose hydrothermal processes for crystal growth of potassium titanyl phosphate, wherein favorable growth of potassium titanyl phosphate crystals can be maintained at relatively lower temperatures. Belt et al. discloses experiments where crystal growth is performed near 400° C.; and presents a list of the main experimental conditions for high temeprature (590° C., 25,000 psi) growth and low temperature (475° C., 21,000 psi) growth. U.S. Pat. No. 4,654,111 discloses a process which achieves increased crystal growth rate at at relatively lower temperature ranges, e.g. 350°–450° C., but warns that the use of a potassium concentration in the mineralizer outside the range of 0.5 to 6.0 molar, calculated as elemental potassium, leads to poor quality crystal growth. The temperature reduction reportedly allows for the use of somewhat less expensive reaction vessels and, consequently, provides for a more economic process.

While substantial progress has been made in reducing the temperatures associated with hydrothermal crystal growth processes, the relatively high reaction pressures typically associated with the hydrothermal process can still limit the practical application of the process. For example, while lower temperatures allow the use of noble metal clad vessels for crystal growth, rather than containers within other containers, and the use of low carbon steel vessels, these less expensive reaction vessels may be limited in size due to the high pressures associated with this hydrothermal process.

SUMMARY OF THE INVENTION

It has now been found that an improved hydrothermal process using mineralizers relatively high in potassium produces potassium titanyl phosphate crystals of high optical quality and has the surprising effect of allowing the hydrothermal process to operate at relatively low pressures, as well at the lower temperature ranges discussed in the art, e.g. 350°–500° C. This concept is considered useful for the production of certain other optical quality crystals as well.

Accordingly, this invention provides for an improved hydrothermal process for growing a crystal of $MTiOXO_4$ at an elevated temperature, wherein M is selected from the group consisting of K, Rb, Tl and $NH_4$ and mixtures thereof and X is selected from the group consisting of P and As and mixtures thereof. In general, the hydrothermal process for crystal growth of this invention employs a growth medium comprising mineralizer solution and is characterized as employing mineralizer solution in which the concentration of M (i.e., the concentration of K, Rb, Tl and/or $NH_4$ corresponding to the crystal M component) is at least about 8 molar, and as either employing a growth region temperature of less than about 500° C., or employing a crystal growth pressure of less than 14,000 psi, or both, during crystallization. For example, a typical hydrothermal process incorporating this invention comprises the steps of (1) providing in a vessel (a) means for nucleating growth of a crystal of $MTiOXO_4$ in a growth region, (b) a growth medium comprising nutrient for growing said crystal of $MTiOXO_4$ and an aqueous solution of mineralizer containing a selected concentration of the M (i.e., K, Rb, Tl or $NH_4$) in a nutrient region, and (c) means for producing a temperature gradient between said growth region and said nutrient region; (2) employing in said nutrient region a nutrient temperature sufficient to effect solution of at least a portion of said nutrient; and (3) employing in said growth region an elevated growth temperature which is lower than said nutrient temperature and a pressure whereby growth of said crystal is initiated; said concentration of M in the aqueous solution of mineralizer being an amount, at least about 8 molar (i.e., at least about 4 molar as $M_2HXO_4$), which is effective to provide crystal growth at either a growth temperature of less than about 500° C., or a pressure of less than 14,000 psi, or both. Preferably the concentration of M is about 10 molar or more, and crystal growth occurs at a pressure at about 9,000 psi or less. The concentration of M is preferably 20 molar or less; most preferably 15 molar or less. Generally the aqueous solution of mineralizer will also contain a concentration of the respective X (i.e. P or As) and it is further preferred that the mole ratio of M:X in the aqueous solution of mineralizer be in the range of 2.2:1 to 1.2:1, and more preferably from 2.0:1 to 1.4:1. Preferably, the nutrient temperature is about 450° C. or less.

DETAILED DESCRIPTION OF THE INVENTION

The invention resides in the use of a hydrothermal process which employs certain relatively concentrated mineralizer solutions to achieve low pressure and/or low temperature growth of crystalline materials of the formula $MTiOXO_4$, wherein M is selected from the group consisting of K, Rb, Tl and $NH_4$ and mixtures thereof, preferably K, and X is selected from the group consisting of P and As and mixtures thereof, preferably P. More particularly, the hydrothermal process for crystal growth at elevated temperature in a growth region employs a growth medium comprising mineralizer solution and is characterized as employing aqueous mineralizer solution in which the concentration of M is at least about 8 molar, and as employing either growth region temperature of less than about 500° C., or employing a pressure of less than 14,000 psi, or both, during crystallization. Growth rates greater than 2 mm/side/week can be achieved at even the relatively lower temperatures studied in the art (i.e., 500° C. or less), and at operating pressures significantly lower than those used in prior hydrothermal processes, specifically less than 14,000 psi, and preferably about 9000 psi or less. For the best combination of effective crystal growth and economics of operation, the crystal growth pressure for the present invention is commonly in the range of from 2,000 to 8,000 psi.

The general procedure used for hydrothermal crystal growth is well known in the art and involves conducting the crystal growth at elevated temperature and pressure in a pressure vessel containing a means for nucleating crystal growth and a growth medium comprising a nutrient and an aqueous mineralizer solution. The preferred means for nucleating crystal growth are seed crystals which provide nucleation sites. In accordance with this invention seed crystals of $MTiOXO_4$, as defined above, can be utilized. Typical hydrothermal processes usually use a high pressure vessel or container in which single crystal seeds of the desired product are hung in a relatively cool zone (i.e. a growth region) and a large quantity of polycrystalline nutrient of the same material is maintained in a warmer zone (i.e. a nutrient region), all together with an aqueous solution of mineralizer in which the nutrient is suitably soluble. When heated under pressure, the nutrient dissolves in the warmer zone, is transported to the cooler zone via convection or concentration gradients and is deposited on the seed crystals. Large crystals are thereby produced.

The aqueous solution of mineralizer in combination with a nutrient consisting of a polycrystalline form of $MTiOXO_4$ or in combination with suitable precursors thereof makes up the growth medium. The amount of nutrient is not critical provided enough is present to saturate the growth medium and provide sufficient material for the desired mass increase on the seed crystal(s). Nutrient surface area is typically 5 to 10 times the surface area of the seed crystal(s) so that the rate of nutrient dissolution does not undesirably limit crystal growth.

The mineralizer should contain both M and X, as defined above, to achieve desirable growth rates. For example, materials such as described by Belt et al., "Nonlinear Optic Materials for Second Harmonic Generation (KTP)", Avionics Laboratory, Air Force Wright Aeronautical Laboratories, Air Force Systems Command, Wright-Patterson Air Force Base, Ohio (1984), formed from the combination of $MH_2XO_4$ and $M_2HXO_4$ are suitable. In accordance with this invention it is preferred that the mole ratio of M to X in the mineralizer solution is from about 2.2:1 to about 1.2:1 to avoid formation of material other than the desired $MTiOXO_4$, such as anatase ($TiO_2$). If desired, an oxidizing agent, such as $KNO_3$, can be present in the growth medium in small concentrations to enhance crystal quality.

To minimize the possibility that seed crystals may dissolve in the aqueous solution of mineralizer before the nutrient can migrate to the seed crystals, it is preferred that the mineralizer is comprised, at least in part, of a stable glass being of the system corresponding to the crystal, i.e. $M_2O/X_2O_5/(TiO_2)_2$, wherein M and X are defined as above. Materials such as those described in U.S. Pat. No. 4,305,778 are especially useful for this purpose.

In accordance with the practice of this invention the concentration of M in the aqueous solution of mineralizer should be at least 8 molar (as M), preferably 10 molar or more, and is preferably 20 molar or less, more preferably 15 molar or less. A concentration of M from about 10 to 15 molar is considered particularly suitable for many applications. It is recognized that concentrations of M as high as 20 molar may not be achieved at room temperature, but can be achieved at the higher temperatures of operation. Consequently, solid material might be added with the aqueous solution of mineralizer, which would dissolve upon heating to provide an aqueous solution of mineralizer of the desired concentration.

A typical hydrothermal process using the instant invention comprises the steps of (1) providing in a vessel (a) means for nucleating growth of a crystal of $MTiOXO_4$ in a growth region, (b) a growth medium comprising nutrient for growing said crystal of $MTiOXO_4$ and an aqueous solution of mineralizer containing a selected concentration of the M (i.e., K, Rb, Tl or $NH_4$) in a nutrient region, and (c) means for producing a temperature gradient between said growth region and said nutrient region; (2) employing in said nutrient region a nutrient temperature sufficient to effect solution of at least a portion of said nutrient; and (3) employing in said growth region an elevated growth temperature which is lower than said nutrient temperature and a pressure whereby growth of said crystal is initiated. As noted above the concentration of M in the aqueous solution of mineralizer is an amount (at least about 8 molar) which is effective to provide crystal growth at a low growth temperature (i.e., a growth temperature of less than about 500° C.) and/or a low pressure (i.e. a pressure less than 14,000 psi). The hydrothermal process of this invention can employ a nutrient region as well as a growth region such that nutrient is dissolved in a nutrient region and the temperature of the nutrient region is higher than the temperature of the growth region and is about 500° C. or less. Preferably, the nutrient temperature is about 450° C. or less, and is most preferably from about 275° C. to about 425° C.

Under the relatively mild conditions of temperature and pressure typically employed in the practice of this invention, the vessel chosen can be selected from a wide variety of types and sizes which can withstand these reaction temperatures and reaction pressures. Pressure vessel configurations typically utilize a noble metal container, or noble metal-clad container. Platinum and gold are preferred metals for the crystal growth of potassium titanyl phosphate. A ladder-like rod configuration can be used to hang a number of seed crystals in the upper portion of the noble metal container and a perforated baffle plate is used to separate the upper part of the container containing the growth region from the lower part containing a nutrient region. The baffle plate aids in maintaining the thermal gradient during growth Nutrient is placed below the baffle. An aqueous solution of mineralizer is loaded into the can along with the seed crystals. The can is sealed and typically placed in an autoclave with a sufficient amount of water to generate a positive pressure on the outer wall of the can at a predetermined maximum operating temperature. If a noble metal lined vessel is used the need for the can is eliminated.

The percentage of fill is defined as the room temperature atmospheric pressure volume of the solution divided by the free volume of the vessel, i.e., the vessel volume less the volume of nutrient, seed crystals, frame or ladder, and baffle. Common practice according to the art is to limit percentage so that excessive pressure is not encountered at the growth temperature, and a preferred fill range from 70 to 80% has been recommended. The art further teaches that at percentages of fill above about 85% the pressure is generally excessive and vessel integrity can be compromised. In accordance with this invention percentages of fill of about 85 to 90% can easily be used coupled with the mineralizer solutions and temperatures described above without compromising vessel integrity, as the pressures developed are less than 14,000 psi and are typically lower than 9,000 psi.

The following non-limiting examples further illustrate practice of the invention.

EXAMPLES

General Procedure

A gold tube 1.98" (5.03 cm) outside diameter and about 14" long (35.56 cm) was sealed at one end and charged with, in the following order: a measured quantity of $MTiOXO_4$ nutrient in the form of coarse, granular material, having the texture of course beach sand, was placed in the lower ¼ of the tube; a perforated baffle plate was used to separate the upper ¾ of the tube from the lower ¼ of the tube; and a support ladder with a number of $MTiOXO_4$ seed crystals suspended thereon was placed in the upper ¾ of the tube. In addition, small quantities of a $MTiOXO_4$ glass prepared in accordance with U.S. Pat. No. 4,305,788 and/or $MNO_3$ may be used to prevent seed solution and maintain an oxidizing condition. Before sealing the gold tube, a measured quantity of a $M_2HXO_4$ aqueous solution of mineralizer was placed into the gold tube. The gold tube was then placed in an autoclave with a sufficient amount of water to generate a positive pressure on the outer wall of the tube. The autoclave was then externally heated using a heating configuration that permits a temperature gradient over the length of the autoclave. During the entire heating cycle the internal pressure of the autoclave was monitored with a strain gage transducer.

The $KTiOPO_4$ glass used in the Examples which follow was prepared in accordance with the precedure described in Example 4 of U.S. Pat. No. 4,305,778. Specifically, 40.35 g $TiO_2$, 116.74 g of $KH_2PO_4$ and 61.48 g of $K_2HPO_4$ were mechanically combined and rapidly melted in a platinum crucible placed in a muffle furnace at a temperature of 1000° C. After insuring that all the components had dissolved, the melt was cast onto a thick aluminum plate to quench the resulting glass. After cooling, the cracked glass sections were stored without any further size reduction. For use, the sections were broken up, weighed and calculated quantities of the glass were added directly on the baffle before sealing the gold tube.

All temperatures are expressed in degrees Centigrade (°C.) and all percentage compositions are expressed as percent by weight, unless otherwise noted.

EXAMPLE 1

The gold tube was charged with nutrient and mineralizer solution after taking into account the volume of the internal gold hardware, i.e., ladder and perforated baffle, and other solids present, e.g., $KTiOPO_4$ nutrient and $KTiOPO_4$ seed crystals. The nutrient consisted of 61.5 g of $KTiOPO_4$ particles having the following size distribution: about 66% between $-5$ and $+18$ mesh size, about 23% between $-18$ and $+35$ mesh size and about 11% less than $-35$ mesh size. In addition 9.68 g of $KTiOPO_4$ glass was charged to the top of the baffle to provide a rapidly soluble $KTiOPO_4$ precursor to minimize seed solution. Four $KTiOPO_4$ seed crystals were measured, weighed and suspended with a fine gold wire from the gold support ladder. Two of the seeds were {011} cuts, the other two {201} and {001} cuts. The gold tube was then charged with a 5 molar aqueous solution of $K_2HPO_4$, which is equivalent to a 10 molar aqueous solution calculated on the basis of elemental potassium, to an effective fill of 89.8%. The gold tube was sealed and placed in the autoclave with sufficient water so that the resulting effective fill was 72.5%. The pressure transducer was attached to the autoclave. The autoclave was then heated using a multiple zone furnace arrangement that permitted a temperature gradient with the top of the tube at 329° and the bottom at 413°. A pressure of 11,980 psig developed within the autoclave in 6 hours. At this pressure and temperature gradient the autoclave was allowed to operate for 17 days, at which time the experiment was terminated.

The tube was removed from the autoclave and the seeds were examined A new growth of excellent quality was found to have taken place on the (011} seeds. The remaining two seeds showed significant growth, but were not of as high a quality as the {011} seeds. Measurements indicated an average growth rate of 0.105 mm/side/week.

EXAMPLE 2

The procedure of Example 1 was followed except that 0.10 g of $KNO_3$ was also added to the gold tube and the effective fill of the gold tube was 89%, and the effective fill of the autoclave was 65%. The autoclave was heated so that the temperature at the top of the tube was 335° and the temperature at the bottom of the tube was 445°. The pressure developed in the autoclave was 7400 psig. The experiment was allowed to proceed under these conditions for 7 days. Excellent growth was obtained on the {011} seeds. On one of the seeds a crack did develop at the point where the gold wire, used to hang the seed on the ladder, was inserted into the seed. Measurements indicated an average growth rate of 0.91 mm/side/week.

EXAMPLE 3

The procedure of Example 2 was followed except that the use of $KNO_3$ was eliminated and the effective autoclave fill was 67%. The top temperature of the tube was 322° and the bottom temperature was 445°. The pressure developed was 7600 psig. The experiment was allowed to run at these conditions for 18 days. Excellent growth was obtained on three {011} seeds. Measurements indicated an average growth rate of 0.91 mm/side/week.

The examples serve to illustrate particular embodiments of the invention. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. An improved hydrothermal process for growing a crystal of $MTiOXO_4$, wherein M is selected from the group consisting of K, Rb, Tl and $NH_4$ and mixtures thereof and X is selected from the group consisting of P and As and mixtures thereof, at an elevated temperature in a pressure vessel which has a growth region wherein said crystal grows and a nutrient region containing nutrient for growing said crystal; said process employing an aqueous mineralizer solution and a growth region temperature which is lower than the nutrient region temperature, the improvement comprising employing an aqueous mineralizer solution in which the concentration of M is at least about 8 molar, and is 20 molar or less, and also employing a nutrient region temperature of about 450° C. or less during crystallization.

2. The hydrothermal process of claim 1 wherein the improvement further comprises employing a pressure of less than 14,000 psi during crystallization; and wherein the nutrient temperature is from about 275° C. to about 425° C.

3. The hydrothermal process of claim 1 wherein crystal growth occurs at a pressure of 9,000 psi or less.

4. The hydrothermal process of claim 1 wherein the pressure is in the range of from 2,000 to 8,000 psi.

5. The hydrothermal process of claim 1 wherein said M concentration is from about 10 to 15 molar.

6. The hydrothermal process of claim 1 wherein the mineralizer solution comprises M and X in a mole ratio of said M to said X from about 2.2:1 to about 1.2:1.

7. The hydrothermal process of claim 1 wherein M is K.

8. The hydrothermal process of claim 7 wherein X is P.

9. The hydrothermal process of claim 1 wherein X is P.

10. The hydrothermal process of claim 1 wherein X is As.

11. A hydrothermal process for growing a crystal of $MTiOXO_4$ wherein M is selected from the group consisting of K, Rb, Tl and $NH_4$ and mixtures thereof and X is selected from the group consisting of P and As and mixtures thereof, which comprises the steps of (1) providing in a vessel (a) means for nucleating growth of a crystal of $MTiOXO_4$ in a growth region, (b) a growth medium comprising nutrient for growing said crystal of $MTiOXO_4$ and an aqueous solution of mineralizer containing a selected concentration of the M in a nutrient region, and (c) means for producing a temperature gradient between said growth region and said nutrient region; (2) employing in said nutrient region a nutrient temperature sufficient to effect solution of at least a portion of said nutrient and; (3) employing in said growth region an elevated growth temperature which is lower than said nutrient temperature and a pressure whereby growth of said crystal is initiated; and which process is characterized by said concentration of M in the aqueous solution of mineralizer being an amount, at least about 8 molar, which is effective to provide crystal growth at a pressure of less than 14,000 psi.

12. The hydrothermal process of claim 11 wherein the nutrient temperature is 450° C. or less.

13. The hydrothermal process of claim 11 wherein crystal growth occurs at a pressure of 9,000 psi or less.

14. The hydrothermal process of claim 11 wherein the pressure is in the range of from 2,000 to 8,000 psi.

15. The hydrothermal process of claim 11 wherein said M concentration is from about 10 to 15 molar.

16. The hydrothermal process of claim 11 wherein the mineralizer solution comprises M and X in a mole ratio of said M to said X from about 2.2:1 to about 1.2:1.

17. The hydrothermal process of claim 11 wherein M is K.

18. The hydrothermal process of claim 17 wherein X is P.

19. The hydrothermal process of claim 11 wherein X is P.

20. The hydrothermal process of claim 11 wherein X is As.

* * * * *